(12) United States Patent
Konishi et al.

(10) Patent No.: US 11,615,971 B2
(45) Date of Patent: Mar. 28, 2023

(54) SUBSTRATE PROCESSING APPARATUS AND PROCESSING LIQUID CONCENTRATION METHOD

(71) Applicant: TOKYO ELECTRON LIMITED, Tokyo (JP)

(72) Inventors: Teruaki Konishi, Koshi (JP); Kouzou Kanagawa, Koshi (JP); Osamu Kuroda, Koshi (JP); Koji Tanaka, Koshi (JP); Kotaro Tsurusaki, Koshi (JP); Hidemasa Aratake, Koshi (JP); Kouji Ogura, Koshi (JP); Keita Hirase, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 231 days.

(21) Appl. No.: 16/712,405

(22) Filed: Dec. 12, 2019

(65) Prior Publication Data

US 2020/0194280 A1  Jun. 18, 2020

(30) Foreign Application Priority Data

Dec. 12, 2018 (JP) .............................. JP2018-232113

(51) Int. Cl.
*H01L 21/67* (2006.01)
*H01L 21/311* (2006.01)

(52) U.S. Cl.
CPC ..... *H01L 21/6708* (2013.01); *H01L 21/31111* (2013.01)

(58) Field of Classification Search
None
See application file for complete search history.

(56) References Cited

U.S. PATENT DOCUMENTS 5,876,280 A * 3/1999 Kitano .............. H01L 21/67017
414/217
6,780,277 B2 * 8/2004 Yokomizo ......... H01L 21/31111
156/345.11
(Continued)

FOREIGN PATENT DOCUMENTS

JP       2006-186065 A       7/2006
JP       2013-232593 A       11/2013
(Continued)

OTHER PUBLICATIONS

Machine Generated English Translation of the Bib data of JP 2017-168857 published Sep. 21, 2017 (Year: 2017).*
(Continued)

*Primary Examiner* — Sylvia Macarthur
(74) *Attorney, Agent, or Firm* — Nath, Goldberg & Meyer; Jerald L. Meyer; Tanya E. Harkins

(57) ABSTRACT

There is provided a substrate processing apparatus including: a processing part configured to process a substrate with a processing liquid; and a processing liquid generation part configured to generate the processing liquid supplied to the processing part. The processing liquid generation part includes: a reservoir configured to store the processing liquid; a circulation line through which the processing liquid stored in the reservoir is circulated; a heater configured to heat the processing liquid; and a nozzle provided at a downstream side of the circulation line and has at least one ejection port formed to eject the processing liquid heated by the heater from above a liquid level of the processing liquid stored in the reservoir.

16 Claims, 8 Drawing Sheets

(56) References Cited

U.S. PATENT DOCUMENTS

| | | | |
|---|---|---|---|
| 10,319,602 B2* | 6/2019 | Kobayashi | H01L 21/67017 |
| 2009/0020226 A1* | 1/2009 | Nam | H01L 21/6708 |
| | | | 156/345.19 |
| 2012/0247504 A1* | 10/2012 | Nasr | H01L 21/67028 |
| | | | 134/1.1 |
| 2015/0262848 A1* | 9/2015 | Sano | H01L 21/681 |
| | | | 156/345.17 |
| 2015/0333380 A1* | 11/2015 | Minamiura | B60L 3/0046 |
| | | | 73/198 |
| 2016/0305688 A1* | 10/2016 | Nakayama | F24H 1/142 |
| 2017/0256426 A1* | 9/2017 | Iwao | H01L 21/67051 |
| 2018/0090306 A1* | 3/2018 | Higashijima | H01L 21/67051 |
| 2019/0096710 A1* | 3/2019 | Sato | H01L 21/67253 |
| 2019/0228990 A1* | 7/2019 | Hinode | H01L 21/0206 |
| 2020/0194280 A1* | 6/2020 | Konishi | H01L 21/67173 |

FOREIGN PATENT DOCUMENTS

| | | | |
|---|---|---|---|
| JP | 2017168857 A | * | 9/2017 |
| JP | 2018-117032 A | | 7/2018 |
| WO | 2018/168874 A | | 9/2018 |

OTHER PUBLICATIONS

Machine Generated English Translation of the Specification of JP 2017-168857 published Sep. 21, 2017 (Year: 2017).*

Machine Generated English Translation of the Claims of JP 2017-168857 published Sep. 21, 2017 (Year: 2017).*

* cited by examiner

SUBSTRATE PROCESSING APPARATUS AND PROCESSING LIQUID CONCENTRATION METHOD

CROSS-REFERENCE TO RELATED APPLICATION

This application is based upon and claims the benefit of priority from Japanese Patent Application No. 2018-232113, filed on Dec. 12, 2018, the entire contents of which are incorporated herein by reference.

TECHNICAL FIELD

Embodiments disclosed herein relate to a substrate processing apparatus and a processing liquid concentration method.

BACKGROUND

In the related art, there is known a technique for carrying out an etching process, which, out of a silicon nitride film (SiN) and a silicon oxide film ($SiO_2$) laminated on a substrate, selectively etches the silicon nitride film by immersing the substrate in a phosphoric acid processing liquid in a substrate processing apparatus (see, for example, Patent Document 1).

PRIOR ART DOCUMENT

Patent Document

Patent Document 1: Japanese Laid-Open Patent Publication No. 2013-232593

SUMMARY

According to an embodiment of the present disclosure, there is provided a substrate processing apparatus including: a processing part configured to process a substrate with a processing liquid; and a processing liquid generation part configured to generate the processing liquid supplied to the processing part. The processing liquid generation part includes: a reservoir configured to store the processing liquid; a circulation line through which the processing liquid stored in the reservoir is circulated; a heater configured to heat the processing liquid; and a nozzle provided at a downstream side of the circulation line and has at least one ejection port formed to eject the processing liquid heated by the heater from above a liquid level of the processing liquid stored in the reservoir.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a substrate processing apparatus and a processing liquid concentration method disclosed herein will be described in detail with reference to the accompanying drawings. Further, the present disclosure is not limited to embodiments described below. In addition, it should be noted that the drawings are schematic, and the relationships between dimensions of respective elements, the ratios of the respective elements, and the like may differ from reality. Also, there may be a case where the relationship of dimensions and the ratios differ from each other between the drawings.

In the related art, there is known a technique for carrying out an etching process, which, out of a silicon nitride film (SiN) and a silicon oxide film (SiO2) laminated on a substrate, selectively etches the silicon nitride film by immersing the substrate in a phosphoric acid processing liquid in a substrate processing apparatus.

In addition, in order to improve the efficiency of the etching process, a phosphoric acid aqueous solution, which is a raw material of the phosphoric acid processing liquid, may have a concentration higher than that (e.g., 85 wt %) of a commercially available phosphoric acid aqueous solution.

However, in the related art, since it takes a prolonged period of time to concentrate the phosphoric acid aqueous solution to have a desired concentration, a phosphoric acid processing liquid using the phosphoric acid aqueous solution as a raw material may not be supplied to a process tank at a desired time. As a result, the throughput of the etching process using the phosphoric acid processing liquid may be reduced.

Therefore, it is expected that the phosphoric acid aqueous solution serving as a raw material of the phosphoric acid processing liquid is efficiently concentrated to have a desired concentration.

<Configuration of Substrate Processing Apparatus>

Figure 1:
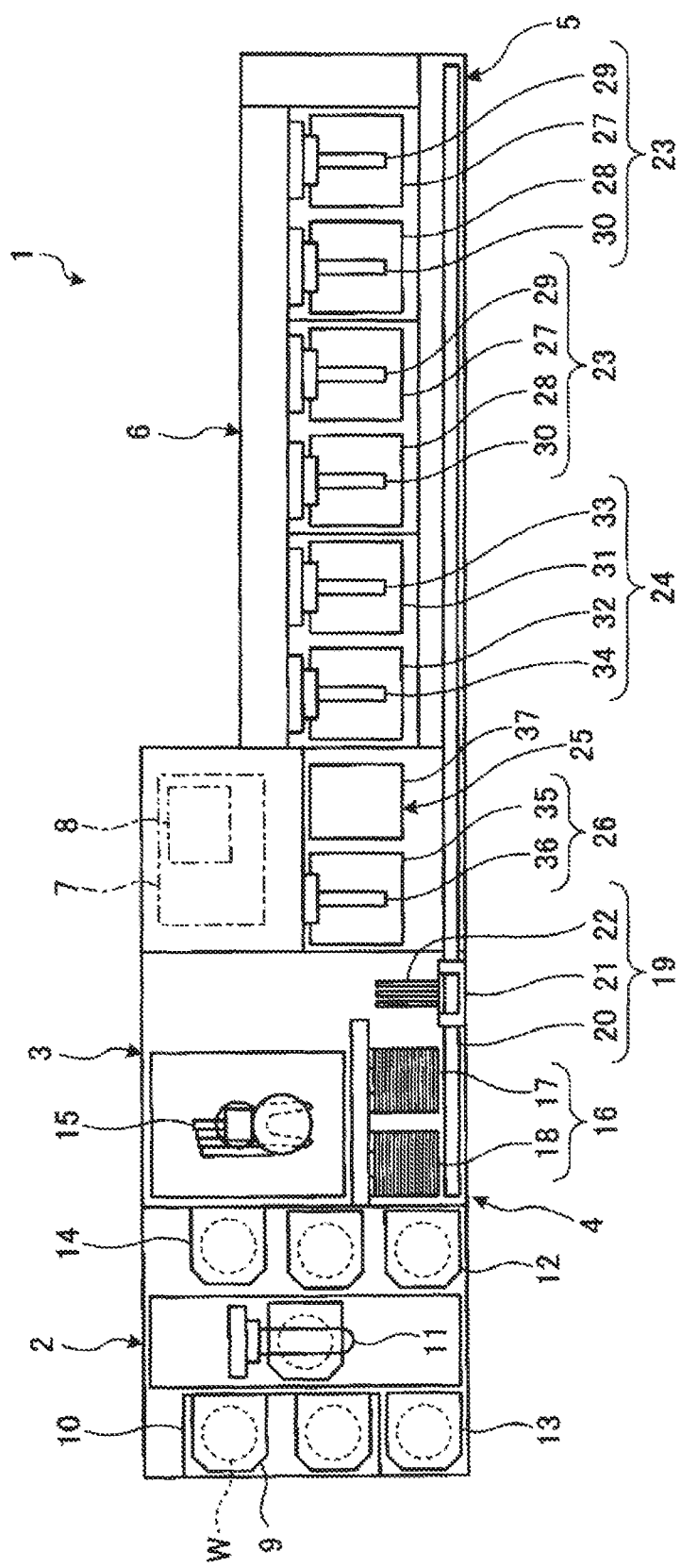
FIG. 1 is a schematic plan view of a substrate processing apparatus according to an embodiment.

First, the configuration of a substrate processing apparatus 1 according to an embodiment will be described with reference to FIG. 1. FIG. 1 is a schematic plan view illustrating the substrate processing apparatus 1. For clarification of a positional relationship, an X-axis direction, a Y-axis direction, and a Z-axis direction, which are orthogonal to one another, are defined in the following description and a positive Z-axis direction is defined as a vertical upward direction.

As illustrated in FIG. 1, the substrate processing apparatus 1 according to the embodiment includes a carrier loading/unloading part 2, a lot formation part 3, a lot placement part 4, a lot transfer part 5, a lot processing part 6, and a controller 7.

The carrier loading/unloading part 2 performs loading/unloading of a carrier 9, which accommodates therein a plurality of (e.g., 25) wafers W aligned vertically in a horizontal posture.

The carrier loading/unloading part 2 includes a carrier stage 10, a carrier transfer mechanism 11, carrier stocks 12 and 13, and a carrier placement table 14. The carrier stage 10 is configured to place thereon a plurality of carriers 9 transferred from the outside.

The carrier transfer mechanism 11 transfers the carrier 9 between the carrier stage 10, the carrier stocks 12 and 13, and the carrier placement table 14. Each of the carrier stocks 12 and 13 temporarily stores the carrier 9.

The carrier stock 12 temporarily stores the carrier 9 that accommodates the plurality of wafers W before being processed by the lot processing part 6. The carrier stock 13 temporarily stores the carrier 9 that accommodates the plurality of wafers W processed by the lot processing part 6.

From the carrier 9 placed on the carrier placement table 14, a plurality of unprocessed wafers W are unloaded to the lot processing part 6 by a substrate transfer mechanism 15 to be described later. In addition, a plurality of processed wafers W are unloaded into the carrier 9 placed on the carrier placement table 14 from the lot processing part 6 by the substrate transfer mechanism 15.

Among the carriers 9 that accommodate the plurality of processed wafers W, one that has been transferred to the carrier stage 10 is unloaded to the outside.

The lot formation part 3 includes the substrate transfer mechanism 15, and forms a lot. The lot is composed of a plurality of (e.g., 50) wafers W, which are simultaneously processed by combining the wafers W accommodated in one or more of carriers 9.

When the lot formation part 3 forms a lot, the lot may be formed such that front surfaces of the wafers W, on which patterns are formed, face each other, or such that all the front surfaces, on which patterns are formed, are oriented to one direction.

The substrate transfer mechanism 15 transfers the plurality of wafers W. The substrate transfer mechanism 15 may be configured to change the posture of each wafer W from the horizontal posture to the vertical posture and vice versa during the transfer of each wafer W.

The substrate transfer mechanism 15 transfers each wafer W from the carrier 9 placed on the carrier placement table 14 to the lot placement part 4. In addition, the substrate transfer mechanism 15 transfers each wafer W from the lot placement part 4 to the carrier 9 placed on the carrier placement table 14.

The substrate transfer mechanism 15 includes two kinds of substrate supporting parts, namely an unprocessed substrate supporting part configured to support the unprocessed wafers W, and a processed substrate supporting part configured to support the processed wafers W. This makes it possible to prevent particles that have adhered to the unprocessed wafers W from adhering to the processed wafers W.

The lot placement part 4 includes a lot transfer table 16 and temporarily places (is temporarily allowed to wait) lots to be transferred between the lot formation part 3 and the lot processing part 6 by the lot transfer part 5 on the lot transfer table 16. The lot transfer table 16 includes a loading-side lot placement table 17 and an unloading-side lot placement table 18.

An unprocessed lot formed by the lot formation part 3 is placed on the loading-side lot placement table 17. A processed lot processed by the lot processing part 6 is placed on the unloading-side lot placement table 18. A plurality of wafers W corresponding to one lot is placed on each of the loading-side lot placement table 17 and the unloading-side lot placement table 18 disposed at front and back sides in a state where the wafers W are arranged side by side in a vertical posture.

The lot transfer part 5 includes a lot transfer mechanism 19, and transfers the lot between the lot placement part 4 and the lot processing part 6 or inside the lot processing part 6. The lot transfer mechanism 19 includes a rail 20, a moving body 21, and a substrate holder 22.

The rail 20 is disposed along the X-axis direction across the lot placement part 4 and the lot processing part 6. The moving body 21 is configured to be movable along the rail 20 while holding the plurality of wafers W. The substrate holder 22 is provided on the moving body 21 and holds the plurality of wafers W arranged in a vertical posture in forward and backward directions.

The lot transfer part 5 transfers the unprocessed lot placed on the loading-side placement table 17 to the lot processing part 6. In addition, the lot transfer part 5 transfers the processed lot processed by the lot processing part 6 to the unloading-side lot placement table 18. In addition, the lot transfer part 5 transfers each lot inside the lot processing part 6.

The lot processing part 6 performs an etching process, a cleaning process, and a drying process on the plurality of wafers W arranged in a vertical posture in forward and backward directions as one lot. In the lot processing part 6, two etching apparatuses 23, a cleaning apparatus 24, a substrate holder cleaning apparatus 25, and a drying apparatus 26 are provided side by side along the rail 20.

Each of the etching apparatuses 23 performs the etching process on each lot. The cleaning apparatus 24 performs the cleaning process on each lot. The substrate holder cleaning apparatus 25 performs the cleaning process on the substrate holder 22. The drying apparatus 26 performs the drying process on each lot. In addition, the numbers of etching apparatuses 23, cleaning apparatuses 24, substrate holder cleaning apparatuses 25, and drying apparatuses 26 are not limited to the example of FIG. 1.

The etching apparatus 23 includes an etching process bath 27, a rinsing process bath 28, and substrate lifting mechanisms 29 and 30. The etching process bath 27 is an example of a processing part. The etching process bath 27 stores a processing liquid for etching (hereinafter, referred to as an "etching liquid"). Details of the etching process bath 27 will be described later.

The rinsing process bath 28 stores a processing liquid for rinsing (e.g., pure water). The plurality of wafers W corresponding to a lot are held by each of the substrate lifting mechanisms 29 and 30 while being arranged side by side in a vertical posture in forward and backward directions.

The etching apparatus 23 holds the lot transferred by the lot transfer part 5 using the substrate lifting mechanism 29, and immerses the lot in the etching liquid of the etching process bath 27 to perform the etching process on the lot. The etching process is performed, for example, for about 1 hour to 3 hours.

The lot etched in the etching process bath 27 is transferred to the rinsing process bath 28 by the lot transfer part 5. The etching apparatus 23 holds the transferred lot using the substrate lifting mechanism 30 and immerses the lot in the rinsing liquid of the rinsing process bath 28 to perform a rinsing process on the lot. The lot which has been subjected to the rinsing process in the rinsing process bath 28 is transferred to a cleaning process bath 31 of the cleaning apparatus 24 by the lot transfer part 5.

The cleaning apparatus 24 includes the cleaning process bath 31, a rinsing process bath 32, and substrate lifting mechanisms 33 and 34. The cleaning process bath 31 stores a processing liquid for cleaning (e.g., SC-1 (a mixed liquid of ammonia, hydrogen peroxide, and water), or the like).

The rinsing process bath 32 stores a processing liquid for rinsing (e.g., pure water, or the like). The plurality of wafers W corresponding to one lot are held by each of the substrate lifting mechanisms 33 and 34 while being arranged side by side in a vertical posture in forward and backward directions.

The cleaning apparatus 24 holds the lot transferred by the lot transfer part 5 using the substrate lifting mechanism 33, and immerses the lot in the cleaning liquid of the cleaning process bath 31 to perform the cleaning process on the lot.

The lot cleaned in the cleaning process bath 31 is transferred to the process bath 32 by the lot transfer part 5. Then, the cleaning apparatus 24 holds the transferred lot using the substrate lifting mechanism 34, and immerses the lot in the rinsing liquid of the process bath 32 to perform the rinsing process on the lot. The lot rinsed in the process bath 32 is transferred to a drying process bath 35 of the drying apparatus 26 by the lot transfer part 5.

The drying apparatus 26 includes the drying process bath 35 and a substrate lifting mechanism 36. The drying process bath 35 is supplied with a processing gas for drying (e.g., isopropyl alcohol (IPA)). The plurality of wafers W of one lot are held by the substrate lifting mechanism 36 while being arranged side by side in a vertical posture in forward and backward directions.

The drying apparatus 26 holds the lot transferred by the lot transfer part 5 using the substrate lifting mechanism 36, and performs the drying process on the lot with the processing gas for drying supplied into the drying process bath 35. The lot dried in the drying process bath 35 is transferred to the lot placement part 4 by the lot transfer part 5.

The substrate holder cleaning apparatus 25 includes a process bath 37, and is configured to supply a processing liquid for cleaning or a drying gas to the process bath 37. The substrate holder cleaning apparatus 25 supplies the processing liquid for cleaning to the substrate holder 22 of the lot transfer mechanism 19, and further supplies the drying gas, thereby performing the cleaning process on the substrate holder 22.

The substrate processing apparatus 1 is provided with a phosphoric acid aqueous solution source 40a (see FIG. 2) in addition to the respective parts described thus far. The phosphoric acid aqueous solution source 40a is an example of a processing liquid generation part. Details of the phosphoric acid aqueous solution source 40a will be described later.

The controller 7 controls the operations of the respective parts (e.g., the carrier loading/unloading part 2, the lot formation part 3, the lot placement part 4, the lot transfer part 5, the lot processing part 6, the phosphoric acid aqueous solution source 40a, and the like) of the substrate processing apparatus 1. The controller 7 controls the operations of the respective parts of the substrate processing apparatus 1 based on signals provided from switches, various sensors, or the like.

The controller 7 is, for example, a computer, and includes a non-transitory computer-readable storage medium 8. The storage medium 8 stores a program for controlling various processes executed in the substrate processing apparatus 1.

The controller 7 controls the operation of the substrate processing apparatus 1 by reading and executing the program stored in the storage medium 8. In addition, the program may be stored in advance in the computer-readable storage medium 8 and may be installed from another storage medium on the storage medium 8 of the controller 7.

Examples of the computer-readable storage medium 8 may include a hard disk (HD), a flexible disk (FD), a compact disk (CD), a magneto-optical disk (MO), a memory card, and the like.

<Configuration of Etching Process Bath>

Figure 2:
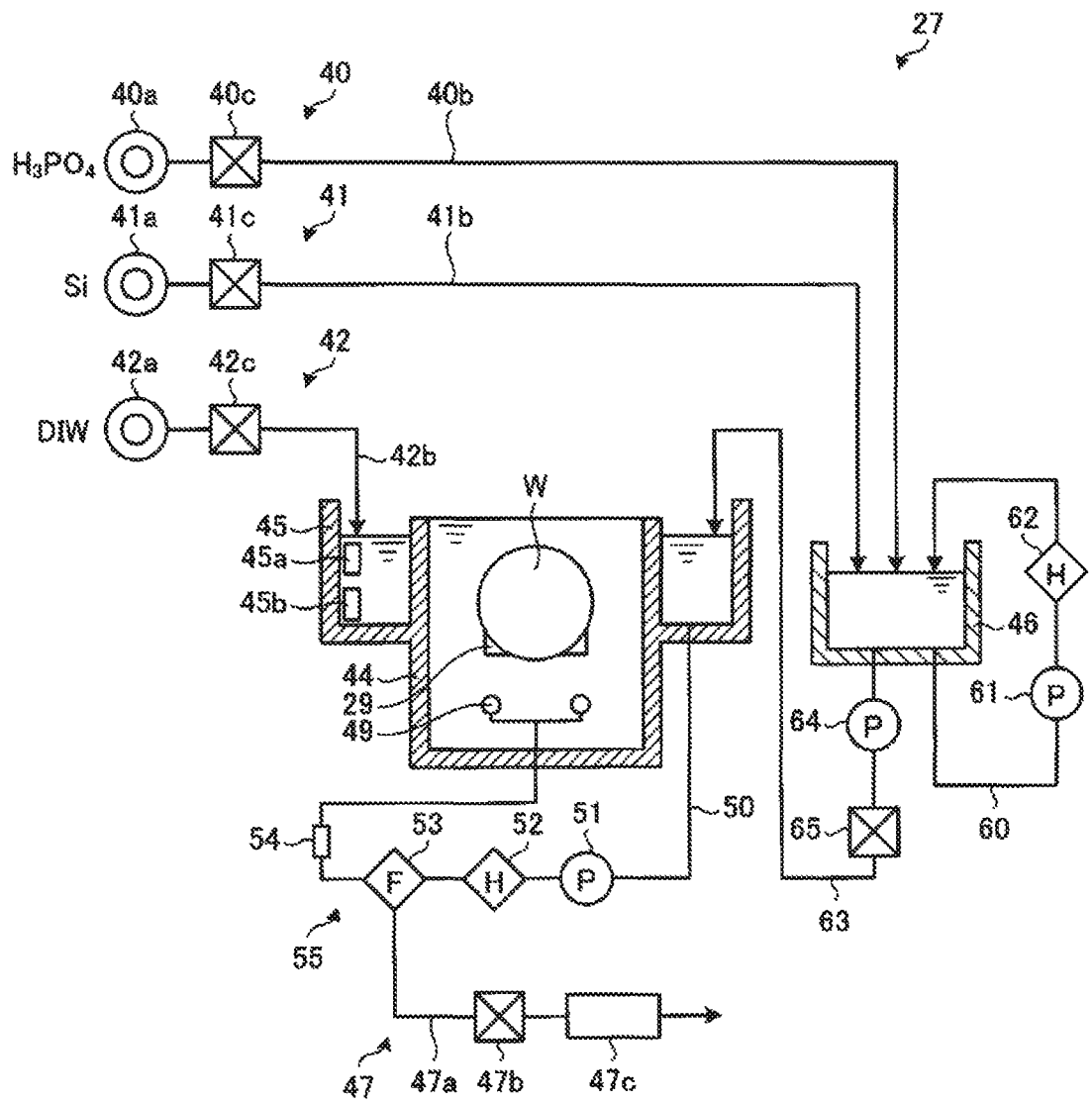
FIG. 2 is a schematic block diagram illustrating the configuration of an etching process bath according to an embodiment.

Next, the etching process bath 27 will be described with reference to FIG. 2. FIG. 2 is a schematic block diagram illustrating a configuration of the etching process bath 27 according to the embodiment.

In the etching process bath 27, out of a silicon nitride film (SiN) and a silicon oxide film ($SiO_2$) formed on the wafer W, the silicon nitride film is selectively etched using a predetermined etching liquid.

In the etching process of the silicon nitride film, a solution, in which a concentration of silicon is adjusted by adding a silicon (Si)-containing compound to a phosphoric acid ($H_3PO_4$) aqueous solution, is generally used as the etching liquid.

As a method for adjusting the concentration of silicon in the etching liquid, a method (seasoning) of immersing a dummy substrate in a phosphoric acid aqueous solution L (see FIG. 3) to dissolve silicon, or a method of dissolving a silicon-containing compound such as colloidal silica in the phosphoric acid aqueous solution L, may be used. In some embodiments, the silicon concentration may be adjusted by adding a silicon-containing compound aqueous solution to the phosphoric acid aqueous solution L.

The etching process bath 27 includes a phosphoric acid aqueous solution supply part 40, a silicon supply part 41, a DIW supply part 42, an inner tank 44, an outer tank 45, a temperature control tank 46, and an etching liquid discharge part 47.

The phosphoric acid aqueous solution supply part 40 includes a phosphoric acid aqueous solution source 40a, a phosphoric acid aqueous solution supply line 40b, and a flow rate regulator 40c.

The phosphoric acid aqueous solution source 40a supplies the phosphoric acid aqueous solution having phosphoric acid concentrated to a desired concentration. The phosphoric acid aqueous solution supply line 40b connects the phosphoric acid aqueous solution source 40a and the temperature control tank 46, and supplies the phosphoric acid aqueous solution L to the temperature control tank 46 from the phosphoric acid aqueous solution source 40a.

The flow rate regulator 40c is provided in the phosphoric acid aqueous solution supply line 40B and adjusts an amount of the phosphoric acid aqueous solution L to be supplied to the temperature control tank 46. The flow rate regulator 40c may include an opening/closing valve, a flow rate control valve, a flowmeter, and the like.

The silicon supply part 41 includes a silicon source 41a, a silicon supply line 41b, and a flow rate regulator 41c.

The silicon source 41a is a tank that stores the silicon-containing compound aqueous solution. The silicon supply line 41b connects the silicon source 41a and the temperature control tank 46, and supplies the silicon-containing compound aqueous solution from the silicon source 41a to the temperature control tank 46.

The flow rate regulator 41c is provided in the silicon supply line 41b and regulates an amount of the silicon-containing compound aqueous solution to be supplied to the temperature control tank 46. The flow rate regulator 41c includes, for example, an opening/closing valve, a flow rate control valve, a flowmeter, and the like. The concentration of silicon in the etching liquid is adjusted by regulating the supply amount of the silicon-containing compound aqueous solution by the flow rate regulator 41c.

The silicon supply part 41 may be configured to supply the silicon-containing compound aqueous solution to the outer tank 45. This makes it possible for the silicon supply part 41 to directly adjust the concentration of silicon in the etching liquid when the concentration of silicon in the etching liquid decreases during the etching process.

The DIW supply part 42 includes a DIW source 42a, a DIW supply line 42b, and a flow rate regulator 42c, The DIW supply part 42 supplies deionized water (DIW) to the outer tank 45 in order to replenish moisture evaporated by heating the etching liquid.

The DIW supply line 42b connects the DIW source 42a and the outer tank 45, and supplies DIW having a predetermined temperature from the DIW source 42a to the outer tank 45.

The flow rate regulator 42c is provided in the DIW supply line 42b and adjusts an amount of DIW to be supplied to the outer tank 45. The flow rate regulator 42c includes, for example, an opening/closing valve, a flow rate control valve, a flowmeter, and the like. The supply amount of DIW is regulated by the flow rate regulator 42c, so that the temperature of the etching liquid, the concentration of phosphoric acid in the etching liquid, and the concentration of silicon in the etching liquid are adjusted.

The inner tank 44 has an opened upper portion. The etching liquid is supplied up to the vicinity of the opened upper portion. In the inner tank 44, the plurality of wafers W are immersed in the etching liquid by the substrate lifting mechanism 29 so that the wafers W are subjected to the etching process.

The outer tank 45 is provided around the upper portion of the inner tank 44, and has an opened upper portion. The etching liquid overflowing from the inner tank 44 flows into the outer tank 45. In addition, a backup liquid from the temperature control tank 46 and DIW from the DIW supply part 42 is supplied into the outer tank 45.

The outer tank 45 is provided with a temperature sensor 45a and a phosphoric acid concentration sensor 45b. The temperature sensor 45a detects a temperature of the etching liquid, and the phosphoric acid concentration sensor 45h detects a concentration of phosphoric acid in the etching liquid. Signals generated by the temperature sensor 45a and the phosphoric acid concentration sensor 45b are transmitted to the controller (see FIG. 1).

The outer tank 45 and the inner tank 44 are connected to each other by a circulation line 50. One end of the circulation line 50 is connected to the outer tank 45, and the other end of the circulation line 50 is connected to a processing liquid supply nozzle 49 installed in the inner tank 44.

A pump 51, a heater 52, a filter 53, and a silicon concentration sensor 54 are provided in the circulation line 50 sequentially from the side of the outer tank 45.

The pump 51 forms a circulating flow of the etching liquid sent from the outer tank 45 to the inner tank 44 through the circulation line 50. In addition, the etching liquid overflows from the inner tank 44 and flows into the outer tank 45 again. In this way, an etching liquid circulation path 55 is formed. That is, the circulation path 55 is formed by the outer tank 45, the circulation line 50, and the inner tank 44.

The heater 52 adjusts the temperature of the etching liquid circulating through the circulation line 50. In the circulation path 55, the outer tank 45 is provided at the upstream side of the heater 52 with respect to the inner tank 44.

The filter 53 filters the etching liquid circulating through the circulation line 50. The silicon concentration sensor 54 detects the concentration of silicon in the etching liquid circulating through the circulation line 50. A signal generated by the silicon concentration sensor 54 is transmitted to the controller 7.

For example, when the etching liquid in the inner tank 44 and the outer tank 45 is completely replaced, a backup liquid obtained by mixing the phosphoric acid aqueous solution L and the silicon-containing compound aqueous solution with each other, is generated and stored in the temperature control tank 46. Further, for example, when some of the etching liquid is replaced during the etching process, the phosphoric acid aqueous solution L is stored as the backup liquid in the temperature control tank 46.

A circulation line 60 is connected to the temperature control tank 46 so as to circulate the backup liquid in the temperature control tank 46 therethrough. A pump 61 and a heater 62 are provided in the circulation line 60. The pump 61 forms a circulating flow of the backup liquid, which returns from the temperature control tank 46 to the temperature control tank 46 through the circulation line 60. The heater 62 adjusts a temperature of the etching liquid circulating through the circulation line 60.

One end of a supply line 63 is connected to the temperature control tank 46. The other end of the supply line 63 is connected to the outer tank 45. A pump 64 and a flow rate regulator 65 are provided in the supply line 63.

The pump 64 causes the backup liquid to flow from the temperature control tank 46 to the outer tank 45. The flow rate regulator 65 regulates an amount of the backup liquid to be supplied to the outer tank 45. The flow rate regulator 65 includes, for example, an opening/closing valve, a flow rate control valve, a flowmeter, and the like. The supply amount of the backup liquid is regulated by the flow rate regulator 65, so that the temperature of the etching liquid, a concentration of phosphoric acid in the etching liquid, and a concentration of silicon in the etching liquid are adjusted.

The etching liquid discharge part 47 discharges the etching liquid when replacing all or some of the etching liquid used in the etching process. The etching liquid discharge part 47 includes a discharge line 47a, a flow rate regulator 47b, and a cooling tank 47c.

The discharge line 47a is connected to the circulation line 50. The flow rate regulator 47b is provided in the discharge line 47a, and regulates an amount of the etching liquid to be discharged. The flow rate regulator 47b includes, for example, an opening/closing valve, a flow rate control valve, a flowmeter, and the like.

The cooling tank 47c temporarily stores and cools down the etching liquid flowing thereinto through the discharge line 47a. In the cooling tank 47c, the discharge amount of the etching liquid is regulated by the flow rate regulator 47b, and pure water is supplied, so that the temperature of the etching liquid, a concentration of phosphoric acid in the etching liquid, and a concentration of silicon in the etching liquid are adjusted.

<Details of Phosphoric Acid Aqueous Solution Source>

Figure 3:
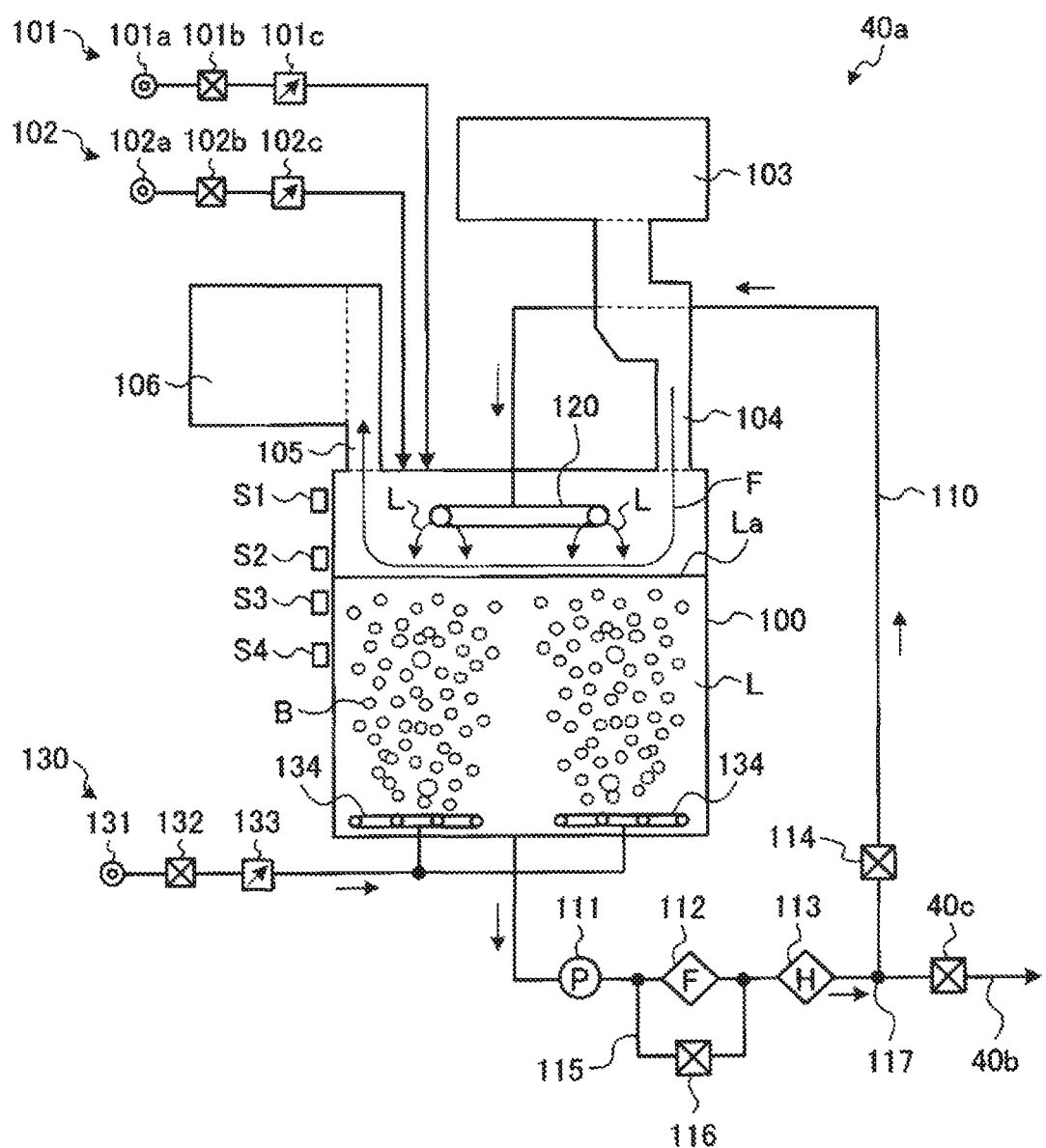
FIG. 3 is a schematic block diagram illustrating the configuration of a phosphoric acid aqueous solution source according to an embodiment.
Figure 4:
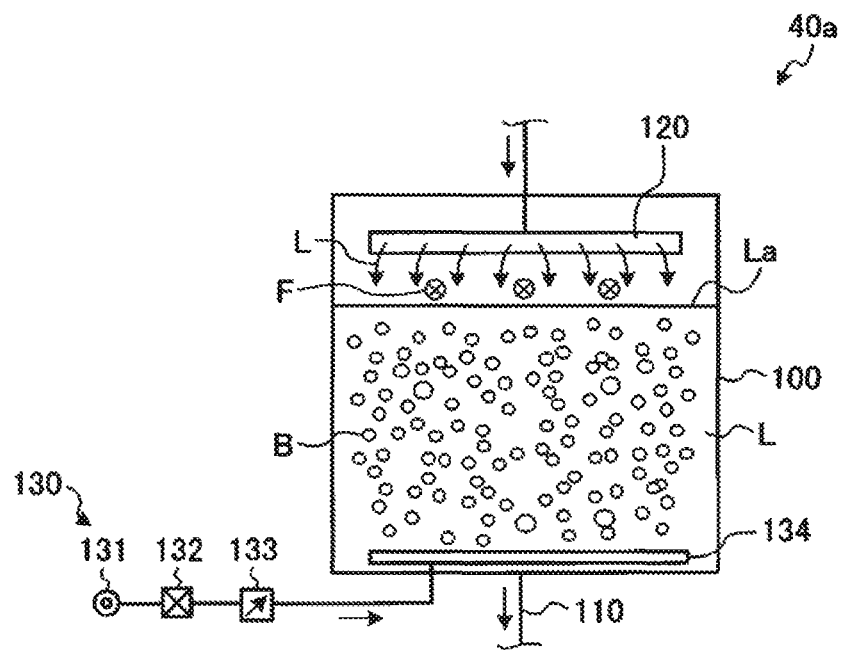
FIG. 4 is a schematic block diagram illustrating the configuration of the phosphoric acid aqueous solution source according to an embodiment.

Next, details of the phosphoric acid aqueous solution source 40*a*, which is an example of a processing liquid generation part according to the embodiment, will be described with reference to FIGS. 3 and 4. FIGS. 3 and 4 are schematic block diagrams illustrating a configuration of the phosphoric acid aqueous solution source 40*a* according to the embodiment. In addition, FIG. 3 is a view obtained when viewing a tank 100 from the front side, and FIG. 4 is a view obtained when viewing the tank 100 from the lateral side.

As illustrated in FIG. 3, the phosphoric acid aqueous solution source 40*a* according to the embodiment includes the tank 100, a circulation line 110, a nozzle 120, and a bubbling mechanism 130. The tank 100 is an example of a reservoir. A phosphoric acid supply part 101 and a DIW supply part 102 are connected to the tank 100.

The phosphoric acid supply part 101 includes a phosphoric acid source 101*a*, a valve 101*b*, and a flow rate regulator 101*c*, and supplies the phosphoric acid aqueous solution L from the phosphoric acid source 101*a* to the tank 100 via the valve 101*b* and the flow rate regulator 101*c*. Thereby, the tank 100 stores the phosphoric acid aqueous solution L.

The phosphoric acid aqueous solution L is an example of a processing liquid. In the embodiment, the phosphoric acid aqueous solution L supplied from the phosphoric acid supply part 101 may be a commercially available phosphoric acid aqueous solution having the highest concentration (e.g., 85 wt %).

The DIW supply part 102 includes a DIW source 102*a*, a valve 102*b*, and a flow rate regulator 102*c*, and supplies the DIW from the DIW source 102*a* to the tank 100 via the valve 102*b* and the flow rate regulator 102*c*. The DIW source 102*a* may be the same as or different from the above-described DIW source 42*a*.

In addition, a fan filter unit (FFU) 103, an intake duct 104, an exhaust duct 105, and a mist trap 106 are provided on an upper portion of the tank 100. The FFU 103 forms a gas flow F that flows through a series of the intake duct 104, the tank 100, and the exhaust duct 105.

That is, the FFU 103, the intake duct 104, and the exhaust duct 105 constitute an airflow formation mechanism configured to form the gas flow F inside the tank 100. The gas flow F formed by the airflow formation mechanism flows along a liquid level La of the phosphoric acid aqueous solution L stored in the tank 100.

The mist trap 106 separates mist generated in the tank 100 from the exhaust gas discharged through the exhaust duct 105.

The circulation line 110 circulates the phosphoric acid aqueous solution L stored in the tank 100 therethrough. The circulation line 110 is a circulation line that starts from the lower side of the tank 100 and returns to the upper side of the tank 100.

A pump 111, a filter 112, a heater 113, and an opening/closing valve 114 are provided in the circulation line 110 in this order from the upstream side with respect to the tank 100. The heater 113 is an example of a heating part.

The pump 111 forms a circulating flow of the phosphoric acid aqueous solution L that starts from the tank 100 and returns to the tank 100 via the circulation line 110. The filter 112 removes contaminants such as particles contained in the phosphoric acid aqueous solution L circulating through the circulation line 110. In addition, a bypass line 115 that bypasses the filter 112 is provided in the circulation line 110. An opening/closing valve 116 is provided in the bypass line 115.

The heater 113 heats the phosphoric acid aqueous solution L circulating through the circulation line 110. In this embodiment, the phosphoric acid aqueous solution L stored in the tank 100 is heated by heating the phosphoric acid aqueous solution L with the heater 113. This makes it possible to evaporate moisture in the phosphoric acid aqueous solution L stored in the tank 100, thus concentrating the phosphoric acid aqueous solution L to a desired concentration (e.g., 90 wt % or more).

For example, in this embodiment, the heater 113 may be controlled to raise the temperature of the phosphoric acid aqueous solution L stored in the tank 100 to a temperature equal to or higher than a boiling point of the phosphoric acid aqueous solution L (e.g., 170 degrees C.).

In the circulation line 110, a branch portion 117 is provided between the heater 113 and the opening/closing valve 114. The above-described phosphoric acid aqueous solution supply line 40*b* is connected to the branch portion 117. In addition, the above-mentioned flow rate regulator 40*c* is provided in the phosphoric acid aqueous solution supply line 40*b*.

The nozzle 120 is provided at the downstream side of the circulation line 110, and ejects the heated phosphoric acid aqueous solution L from above the liquid level La of the phosphoric acid solution L stored in the tank 100. As illustrated in FIG. 4, the nozzle 120 extends in the horizontal direction.

Further, the nozzle 120 includes a plurality of ejection ports (not illustrated) arranged side by side in the horizontal direction to eject the phosphoric acid aqueous solution L therethrough. The phosphoric acid aqueous solution L heated by the heater 113 is ejected in a strip shape from the plurality of ejection ports toward the liquid level La.

In this manner, in this embodiment, in the process of concentrating the phosphoric acid aqueous solution L, the heated phosphoric acid aqueous solution L is ejected from the nozzle 120 into the tank 100. This makes it possible to increase the area of a gas-liquid interface formed between an internal atmosphere of the tank 100 and the phosphoric acid aqueous solution L.

Therefore, according to the embodiment, it is possible to efficiently evaporate moisture in the phosphoric acid aqueous solution L, thus efficiently concentrating the phosphoric acid aqueous solution L to a desired concentration.

In addition, in this embodiment, when the phosphoric acid aqueous solution L, which has been pressurized by the pump 111 inside the circulation line 110, is ejected from the nozzle 120, the pressure is rapidly reduced to atmospheric pressure. When the pressure is rapidly reduced in this manner, the boiling point of the phosphoric acid aqueous solution L is lowered, promoting evaporation of the moisture from the phosphoric acid aqueous solution L.

Therefore, according to the embodiment, it is possible to more efficiently evaporate the moisture in the phosphoric acid aqueous solution L, thus more efficiently concentrating the phosphoric acid aqueous solution L to a desired concentration.

In this embodiment, as illustrated in FIGS. 3 and 4, the phosphoric acid aqueous solution L ejected from the nozzle 120 is ejected in a strip shape toward the liquid level La. The gas flow F formed by the airflow formation mechanism flows between the nozzle 120 and the liquid level La along the liquid level La so as to penetrate the strip-shaped phosphoric acid aqueous solution L.

By forming the gas flow F along the liquid level La of the phosphoric acid aqueous solution L stored in the tank 100, it is possible to promote the evaporation of moisture from the stored phosphoric acid aqueous solution L. Therefore, according to the embodiment, it is possible to efficiently concentrate the phosphoric acid aqueous solution L to a desired concentration.

Further, by forming the gas flow F so as to flow around the phosphoric acid aqueous solution L ejected from the nozzle 120, it is possible to promote the evaporation of moisture from the ejected phosphoric acid aqueous solution L. Therefore, according to the embodiment, it is possible to efficiently concentrate the phosphoric acid aqueous solution L to a desired concentration.

The gas forming the air flow F by the airflow formation mechanism may have a humidity lower than that in the environment in which the substrate processing apparatus 1 is installed. Thus, it is possible to further promote the evaporation of moisture from the phosphoric acid aqueous solution L, thus more efficiently concentrating the phosphoric acid aqueous solution L to a desired concentration.

In addition, the gas flow F formed by the airflow formation mechanism flows so as to penetrate the strip-shaped phosphoric acid aqueous solution L, which makes it possible to further promote contact between the gas and the strip-shaped phosphoric acid aqueous solution L. Thus, it is possible to further promote the evaporation of moisture from the phosphoric acid aqueous solution L, thus more efficiently concentrating the phosphoric acid aqueous solution L to a desired concentration.

In this embodiment, a height of the liquid level La is controlled by providing first to fourth liquid level sensors S1 to S4 in the tank 100 in the named order from the top. This makes it possible to prevent the liquid level La from becoming higher than the nozzle 120 inside the tank 100. The control of the liquid level La using the first to fourth liquid level sensors S1 to S4 will be described later.

The bubbling mechanism 130 bubbles the phosphoric acid aqueous solution L stored in the tank 100 to form bubbling gases B. The bubbling mechanism 130 includes a bubbling gas source 131, a valve 132, a flow rate regulator 133, and a bubbling nozzle 134.

In the bubbling mechanism 130, the bubbling gas B is supplied from the bubbling gas source 131 to the bubbling nozzle 134 through the valve 132 and the flow rate regulator 133. The bubbling nozzle 134 may be provided in a bottom portion of the tank 100, and extend in the horizontal direction.

In addition, the bubbling nozzle 134 has a plurality of ejection ports (not illustrated) arranged side by side in the horizontal direction to eject the bubbling gases B therethrough. By ejecting the bubbling gases B from the plurality of ejection ports, it is possible to bubble the phosphoric acid aqueous solution L stored in the tank 100.

Thus, in this embodiment, by bubbling the phosphoric acid aqueous solution L stored in the tank 100 to form the bubbling gases B, it is possible to increase the area of the gas-liquid interface formed between the bubbling gases B and the phosphoric acid aqueous solution L.

Therefore, according to the embodiment, it is possible to efficiently evaporate moisture in the phosphoric acid aqueous solution thus efficiently concentrating the phosphoric acid aqueous solution L to a desired concentration.

In addition, the bubbling gases B may have a humidity lower than that in the environment in which the substrate processing apparatus 1 is installed. This makes it possible to further promote the evaporation of moisture from the phosphoric acid aqueous solution L, thus more efficiently concentrating the phosphoric acid aqueous solution L to a desired concentration.

In this embodiment, as illustrated in FIG. 3, a plurality of bubbling nozzles 134 may be disposed in the entire bottom portion of the tank 100. Thereby, it is possible to bubble the phosphoric acid aqueous solution L stored in the tank 100 as a whole, thus more efficiently concentrating the phosphoric acid aqueous solution L to a desired concentration.

In this embodiment, the tank 100 may have a closed structure. That is, the upper portion of the tank 100 may be closed rather than being opened. With this configuration, even if the phosphoric acid aqueous solution L stored in the tank 100 is in a boiling state, it is possible to prevent the phosphoric acid aqueous solution L from leaking out of the tank 100.

<Details of Phosphoric Acid Aqueous Solution Concentration Process>

Figure 5:
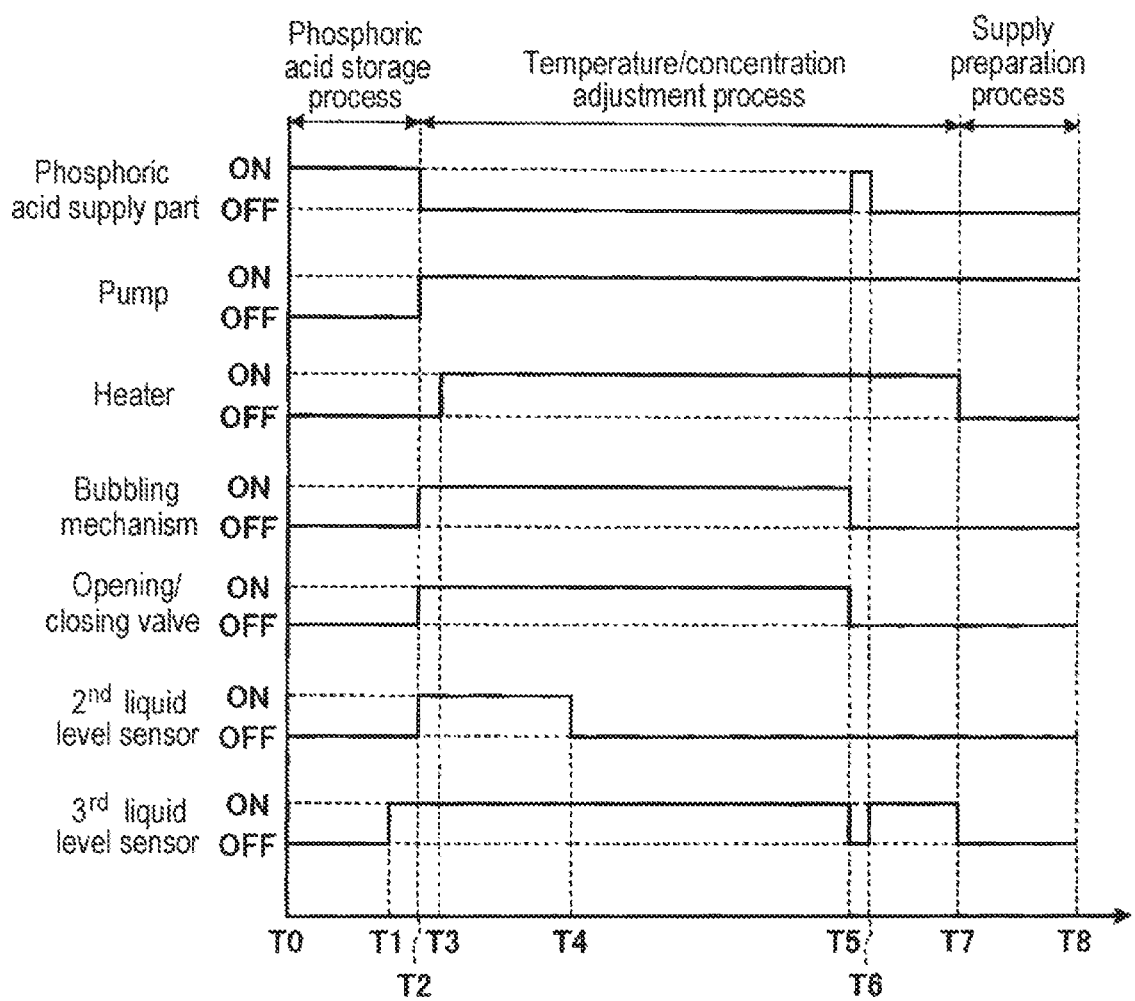
FIG. 5 is a timing chart illustrating a specific example of a behavior pattern of each part of the phosphoric acid aqueous solution source in a phosphoric acid aqueous solution concentration process according to an embodiment.

Next, details of a phosphoric acid aqueous solution concentration process according to the embodiment will be described with reference to FIGS. 5 and 6. FIG. 5 is a timing chart representing a specific example of the behavior pattern of each part of the phosphoric acid aqueous solution source 40a in the phosphoric acid aqueous solution concentration process according to an embodiment. Each part of the phosphoric acid aqueous solution source 40a is controlled by the controller 7.

As illustrated in FIG. 5, in the phosphoric acid aqueous solution concentration process according to the embodiment, a phosphoric acid storage process, a temperature/concentration adjustment process, and a supply preparation process are sequentially performed. First, the controller 7 starts the phosphoric acid storage process by operating the phosphoric acid supply part 101 at time T0 (by turning on the phosphoric acid supply part 101).

Then, when the liquid level La becomes equal to or higher than a predetermined third height at time T1 as the liquid level La of the phosphoric acid aqueous solution L stored in the tank 100 gradually rises, an ON signal is outputted from the third liquid level sensor S3. Subsequently, when the liquid level La becomes equal to or higher than a predetermined second height at time T2 as the liquid level La of the phosphoric acid aqueous solution L rises, an ON signal is outputted from the second liquid level sensor 52.

In this manner, when the liquid level La of the phosphoric acid aqueous solution L stored in the tank 100 reaches the predetermined second height at time T2, the phosphoric acid storage process is completed. Then, at time T2, the controller 7 stops (turns off) the operation of the phosphoric acid supply part 101.

Next, the controller 7 performs the temperature/concentration adjustment process. Specifically, the controller 7 operates the pump 111 and the bubbling mechanism 130 at time T2, and opens (turns on) the opening/closing valve 116 of the bypass line 115. Thereby, the phosphoric acid aqueous solution L circulates through the circulation line 110, and the phosphoric acid aqueous solution L stored in the tank 100 is bubbled.

Further, the controller 7 checks that the phosphoric acid aqueous solution L circulates through the circulation line 110 without any incident, and operates (turns on) the heater 113 at time T3. Thereby, it is possible to heat the phosphoric acid aqueous solution L circulating through the circulation line 110, thus heating the phosphoric acid aqueous solution L stored in the tank 100.

The temperature of the heater 113 may be set to be higher a processing temperature (e.g., 200 degrees C.) of the phosphoric acid aqueous solution L to be concentrated in the tank 100. In some embodiments, the heating process of the phosphoric acid aqueous solution L in the embodiment is not limited to the case in which the heating process is performed by the heater 113 provided in the circulation line 110, and may be performed by providing a heater around or inside the tank 100. That is, the heating part according to the embodiment is not limited to the heater 113.

Meanwhile, by performing the heating process of the phosphoric acid aqueous solution L using the heater 113 provided in the circulation line 110, it is possible to efficiently heat the phosphoric acid aqueous solution L, thus efficiently concentrating the phosphoric acid aqueous solution L.

In this embodiment, when the temperature/concentration adjustment process is started, the opening/closing valve 116 is turned on so that the phosphoric acid aqueous solution L circulates through the bypass line 115 while bypassing the filter 112.

Thereby, it is possible to reduce pressure loss caused by the filter 112 in the circulation line 110, thus efficiently circulating the heated phosphoric acid aqueous solution L. Therefore, according to the embodiment, it is possible to efficiently heat the phosphoric acid aqueous solution L, thus efficiently concentrating the phosphoric acid aqueous solution L.

In addition, it is not necessary to filter the phosphoric acid aqueous solution L with the filter 112 until the phosphoric acid aqueous solution L is concentrated to have a desired concentration. Thus, there is no particular problem even if the phosphoric acid aqueous solution L circulates through the bypass line 115.

Then, as the phosphoric acid aqueous solution L stored in the tank 100 is concentrated, the liquid level La of the phosphoric acid aqueous solution L decreases. When the liquid level La becomes lower than the predetermined second height at time T4, an OFF signal is outputted from the second liquid level sensor S2.

Subsequently, when the liquid level La becomes lower than the predetermined third height at time T5 as the phosphoric acid aqueous solution L stored in the tank 100 is concentrated, an OFF signal is outputted from the third liquid level sensor S3. At this time point, the phosphoric acid aqueous solution L stored in the tank 100 is concentrated to have the desired concentration. Thus, in the embodiment, the concentration process of the phosphoric acid aqueous solution L is managed based on the height of the liquid level La.

Then, at time T5, the controller 7 stops the bubbling mechanism 130 and closes (turns off) the opening/closing valve 116 of the bypass line 115. In addition, the controller 7 refills the phosphoric acid aqueous solution L into the tank 100 by operating the phosphoric acid supply part 101 (by turning on the phosphoric acid supply part 101) at time T5.

Then, when the liquid level La becomes equal to or higher than the predetermined third height at time T6 as the liquid level La of the phosphoric acid aqueous solution L stored in the tank 100 rises, an ON signal is outputted from the third liquid level sensor S3. At time T6, the controller 7 stops (turns off) the operation of the phosphoric acid supply pail 101.

In addition, the controller 7 continuously operates the pump 111 and the heater 113 after time T5, so that the phosphoric acid aqueous solution L heated by the heater 113 is circulated by the pump 111. In addition, the opening/closing valve 116 is closed at time T5. Thus, the controller 7 may cause the filter 112 to filter the phosphoric acid aqueous solution L circulating through the circulation line 110.

The process of filtering the phosphoric acid aqueous solution L with the filter 112 is performed from time T5 to time T7 after a predetermined period of time 10 minutes) from time T5. In the embodiment, it is possible to generate a clean phosphoric acid aqueous solution L through the filtering process. After the phosphoric acid aqueous solution L is filtered for the predetermined period of time in this manner, the temperature/concentration adjustment process is completed at time T7.

In the temperature/concentration adjustment process described thus far, the bubbling mechanism 130 may be stopped at the time at which the phosphoric acid aqueous solution L is concentrated to have the desired concentration (that is, time T5). This makes it possible to prevent the phosphoric acid aqueous solution L stored in the tank 100 from being concentrated in excess of the desired concentration.

In addition, in the temperature/concentration adjustment process, the present disclosure is not limited to the case where the bubbling mechanism 130 is stopped at the time at which the phosphoric acid aqueous solution L is concentrated to have the desired concentration, and may be applied to a case where the flow rate of the bubbling gases B is decreased.

Subsequently, the controller 7 performs the supply preparation process. Specifically, the controller 7 stops (turns off) the operation of the heater 113 at time T7. That is, in the supply preparation process, the pump 111 alone continues to operate.

The supply preparation process is performed from time T7 to time T8 after a predetermined period of time (e.g., 5 minutes) from time T7. In this way, after the predetermined period of time from time T7, the supply reparation process is completed. In this manner, the phosphoric acid aqueous solution concentration process according to the embodiment is completed.

Figure 6:
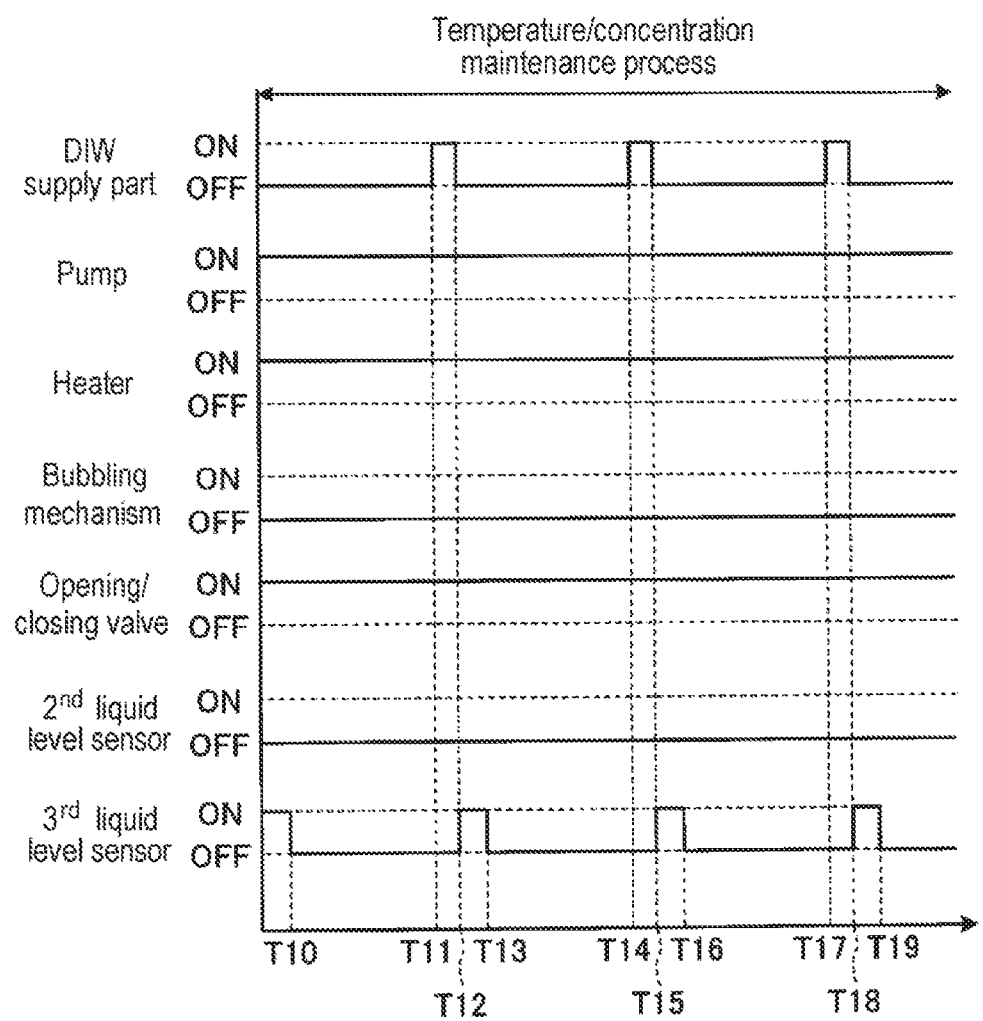
FIG. 6 is a timing chart illustrating a specific example of a behavior pattern of each part of the phosphoric acid aqueous solution source in a temperature/concentration maintenance process according to an embodiment.

FIG. 6 is a timing chart illustrating a specific example of the behavior pattern of each part of the phosphoric acid aqueous solution source 40a in a temperature/concentration maintenance process according to an embodiment. The temperature/concentration maintenance process is performed to maintain the phosphoric acid aqueous solution L at the desired concentration in the case where the phosphoric acid aqueous solution L is not used in the etching process bath 27 after the phosphoric acid aqueous solution L is concentrated to have the desired concentration.

As illustrated in FIG. 6, in the temperature/concentration maintenance process, the controller 7 operates the pump 111 and the heater 113 and opens (turns on) the opening/closing valve 116. Thereby, the phosphoric acid aqueous solution L heated by the heater 113 circulates through the bypass line 115.

In addition, when the liquid level La becomes lower than the predetermined third height at time T10 as the phosphoric acid aqueous solution L stored in the tank 100 is concentrated, an OFF signal is outputted from the third liquid level sensor S3.

In this case, since the phosphoric acid aqueous solution L has been concentrated in excess of the desired concentration, the controller 7 operates (turns on) the DIW supply part 102 at time T11 after a predetermined period of time (e.g., 180 seconds) from time T10. Accordingly, the controller 7 dilutes the phosphoric acid aqueous solution L stored in the tank 100 to have the desired concentration.

In this manner, by operating the DIW supply part 102 after the predetermined period of time from when the OFF signal is outputted from the third liquid level sensor S3, it is possible to prevent the components of the DIW supply part 102 from operating excessively.

Therefore, according to the embodiment, it is possible to prevent a problem from occurring in the components due to the excessive operation of the components of the DIW supply part 102.

Then, when the liquid level La becomes equal to or higher than the predetermined third height at time T12 as the liquid level La of the phosphoric acid aqueous solution L stored in the tank 100 rises, an ON signal is outputted from the third liquid level sensor 53. At time T12, the controller 7 stops (turns off) the operation of the DIW supply part 102.

Thereafter, as illustrated in FIG. 6, whenever the height of the liquid level La becomes lower than the predetermined third height, the controller 7 operates the DIW supply part 102 after the predetermined period of time to replenish DIW. Thus, the height of the liquid level La is maintained at the predetermined third height. Accordingly, it is possible to maintain the phosphoric acid aqueous solution L stored in the tank 100 at the desired concentration.

In the temperature/concentration maintenance process described thus far, the bubbling mechanism 130 may be stopped (turned off). This makes it possible to prevent the phosphoric acid aqueous solution L stored in the tank 100 from being concentrated in excess of a desired concentration.

<Modifications>

Figure 7:
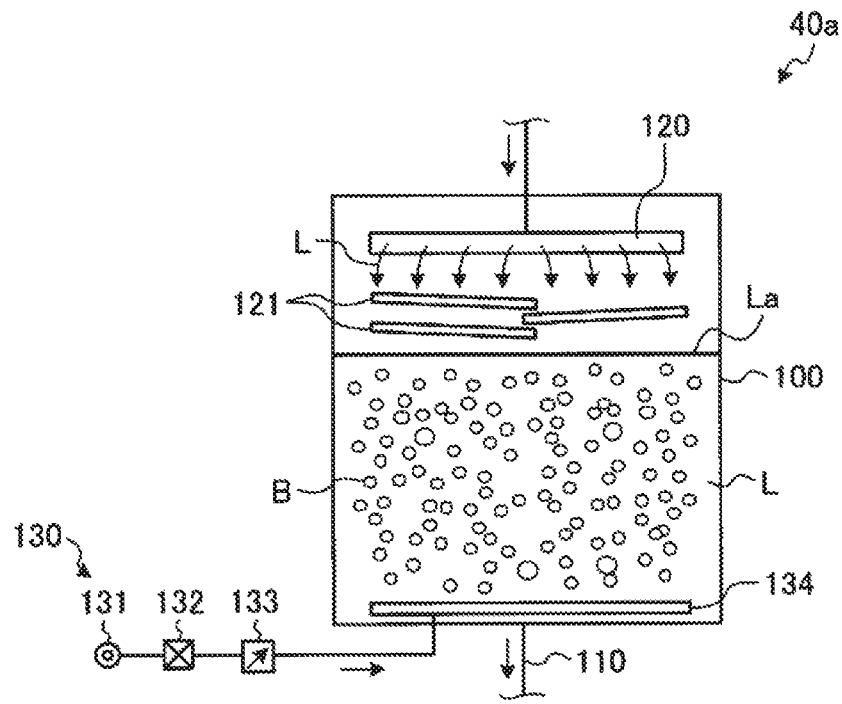
FIG. 7 is a schematic block diagram illustrating the configuration of a phosphoric acid aqueous solution source according to a first modification of the embodiment.

Next, various modifications of the embodiment will be described with reference to FIGS. 7 to 9. FIG. 7 is a schematic block diagram illustrating the configuration of a phosphoric acid aqueous solution source 40*a* according to a first modification of the embodiment.

As illustrated in FIG. 7, in the phosphoric acid aqueous solution source 40*a* of the first modification, a plate member 121 is provided between the nozzle 120 and the liquid surface La of the phosphoric acid aqueous solution L in the tank 100. For example, a plurality of plate members 121 may be provided such that they partially overlap each other.

In the first modification, the phosphoric acid aqueous solution L is ejected from the nozzle 120 toward the plate members 121. Thus, by ejecting the phosphoric acid aqueous solution L from the nozzle 120 into the tank 100 through the plate members 121, it is possible to further increase the area of a gas-liquid interface formed between an internal atmosphere of the tank 100 and the phosphoric acid aqueous solution L.

Therefore, according to the first modification, it is possible to more efficiently evaporate moisture in the phosphoric acid aqueous solution L, thus more efficiently concentrating the phosphoric acid aqueous solution L to have a desired concentration.

Furthermore, in the first modification, by providing the plurality of plate members 121 such that they partially overlap each other, it is possible to prolong a period of time during which the phosphoric acid aqueous solution L stays in the plate members 121. Therefore, according to the first modification, it is possible to more efficiently evaporate moisture in the phosphoric acid aqueous solution L, thus more efficiently concentrating the phosphoric acid aqueous solution L to have the desired concentration.

Figure 8:
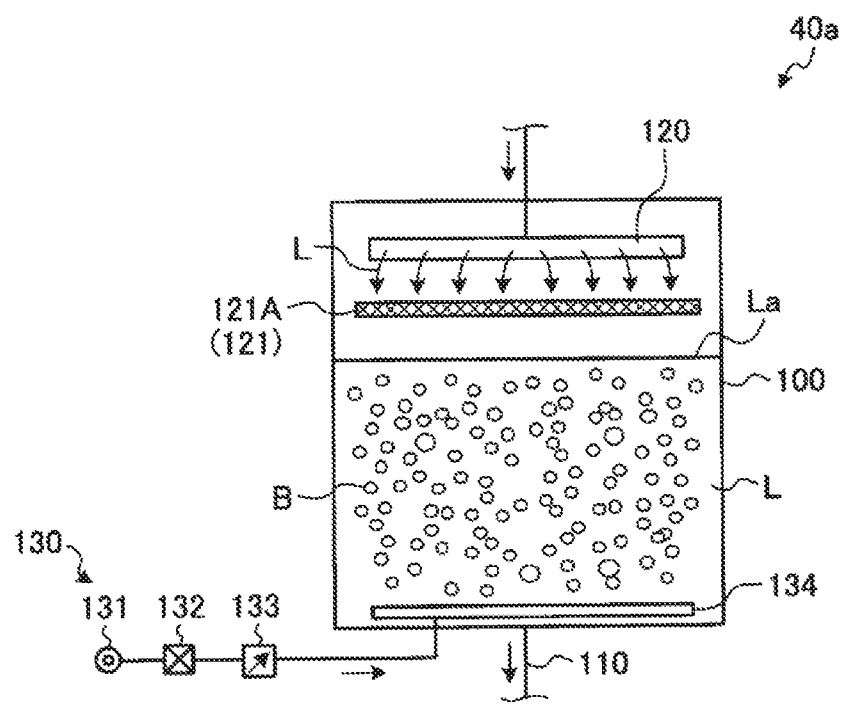
FIG. 8 is a schematic block diagram illustrating the configuration of a phosphoric acid aqueous solution source according to a second modification of the embodiment.

FIG. 8 is a schematic block diagram illustrating a configuration of a phosphoric acid aqueous solution source 40*a* according to a second modification of the embodiment. As illustrated in FIG. 8, in the phosphoric acid aqueous solution source 40*a* according to the second modification, a mesh plate 121A is provided as the plate member 121 between the nozzle 120 and the liquid level La of the phosphoric acid aqueous solution L.

In the second modification, the phosphoric acid aqueous solution L is ejected from the nozzle 120 toward the mesh plate 121A. Thus, by ejecting the phosphoric acid aqueous solution L from the nozzle 120 into the tank 100 through the mesh plate 121A, it is possible to further increase the area of the gas-liquid interface formed between the internal atmosphere of the tank 100 and the phosphoric acid aqueous solution L.

Therefore, according to the second modification, it is possible to more efficiently evaporate moisture in the phosphoric acid aqueous solution L, thus more efficiently concentrating the phosphoric acid aqueous solution L to a desired concentration.

In the first modification and the second modification described above, a heater may be installed in the plate member 121 or the mesh plate 121A, and the plate member 121 and the mesh plate 121A may be heated by the heater. Thereby, it is possible to accelerate the evaporation of the phosphoric acid aqueous solution L staying in the plate member 121 or the mesh plate 121A, thus more efficiently concentrating the phosphoric acid aqueous solution L to a desired concentration.

Although the example in which the plurality of plate members 121 are provided has been described in FIG. 7, a single plate member 121 may be provided. Although the example in which the single mesh plate 121A is provided has been described in FIG. 8, a plurality of mesh plates 121A may be provided.

Figure 9:
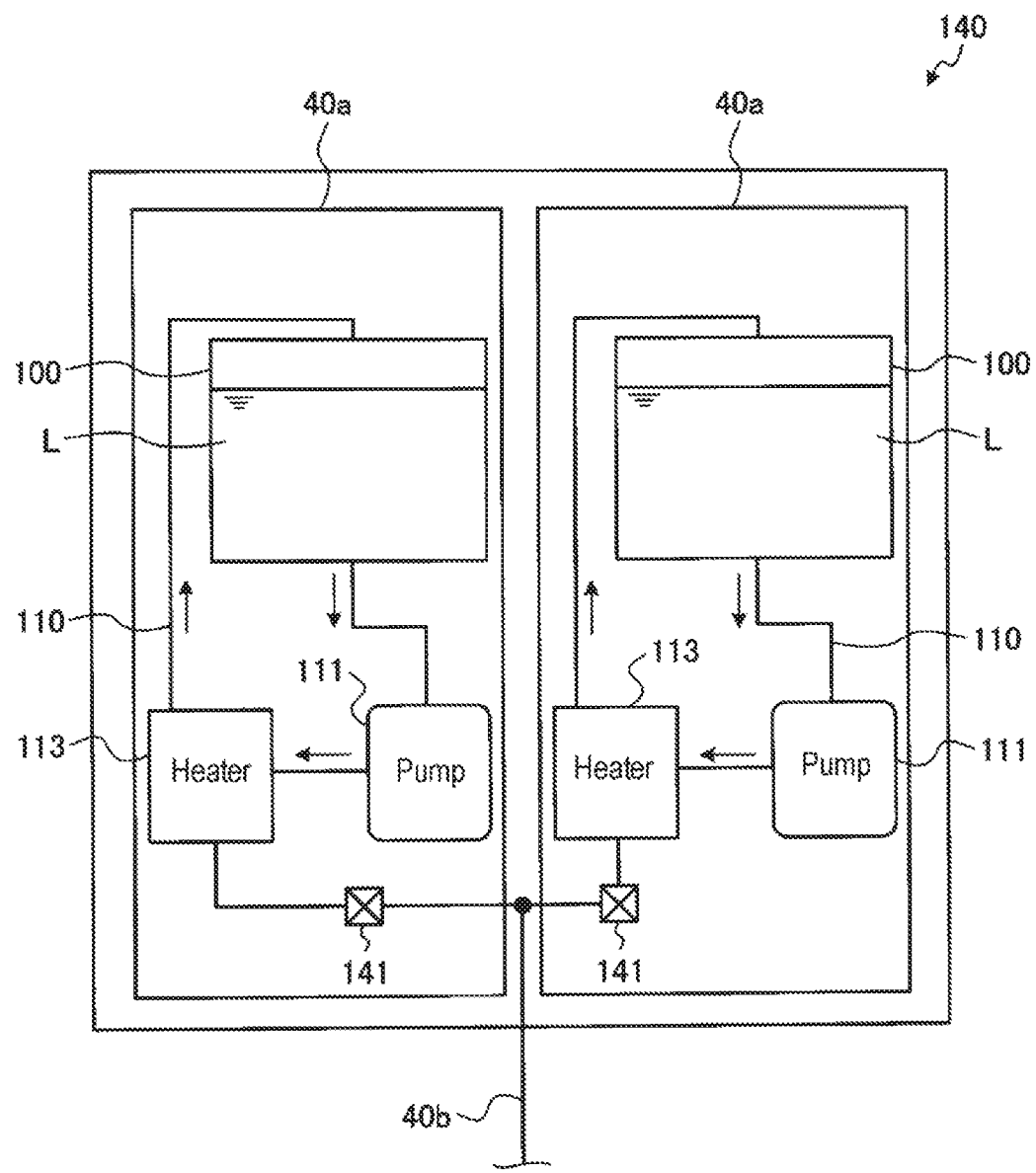
FIG. 9 is a schematic block diagram illustrating the configuration of a phosphoric acid aqueous solution source according to a third modification of the embodiment.

FIG. 9 is a schematic block diagram illustrating a configuration of a phosphoric acid aqueous solution source 40*a* according to a third modification of the embodiment. As illustrated in FIG. 9, the third modification is an example in which a source unit 140 is configured to include a plurality of (two in FIG. 9) phosphoric acid aqueous solution sources 40*a*.

In the source unit 140, it is possible to independently operate the plurality of phosphoric acid aqueous solution sources 40*a* by the controller 7. In addition, a valve 141 is provided between each of the phosphoric acid aqueous solution sources 40*a* and the phosphoric acid aqueous solution supply line 40*b*.

In the third modification, the controller 7 executes the concentration process of the phosphoric acid aqueous solution L using at least one of the phosphoric acid aqueous solution sources 40*a*, and supplies the phosphoric acid aqueous solution L, concentrated to a desired concentration, to the etching process bath 27 (see FIG. 2) from the other phosphoric acid aqueous solution sources 40*a*.

As described above, it is possible to stably supply the phosphoric acid aqueous solution L, concentrated to a desired concentration, to the etching process bath 27 by performing the concentration process and the supply process of the phosphoric acid aqueous solution L in parallel with the plurality of phosphoric acid aqueous solution sources 40*a*. Therefore, according to the third modification, it is possible to stably perform the etching process of the wafer W.

Although there has been described in FIG. 9 the example in which the source unit 140 includes two phosphoric acid aqueous solution sources 40*a*, the source unit 140 may include three or more phosphoric acid aqueous solution sources 40*a*.

The substrate processing apparatus 1 according to the embodiment includes the processing part (the etching process bath 27) configured to process the substrate (the wafer W) with the processing liquid (the phosphoric acid aqueous solution L), and the processing liquid generation part (the phosphoric acid aqueous solution source 40a) configured to generate the processing liquid to be supplied to the processing part. The processing liquid generation part (the phosphoric acid aqueous solution source 40a) includes the reservoir (the tank 100), the circulation line 110, the heating part (the heater 113), and the nozzle 120. The reservoir (the tank 100) stores the processing liquid (the phosphoric acid aqueous solution L). The circulation line 110 circulates the processing liquid (the phosphoric acid aqueous solution L) stored in the reservoir (the tank 100). The heating part (the heater 113) heats the processing liquid (the phosphoric acid aqueous solution L). The nozzle 120 is provided at the downstream side of the circulation line 110, and has the ejection ports through which the processing liquid heated by the heating part (the heater 113) is ejected from above the liquid level La of the processing liquid (the phosphoric acid aqueous solution L) stored in the reservoir (the tank 100). This makes it possible to efficiently concentrate the phosphoric acid aqueous solution L as a raw material of an etching liquid, to a desired concentration.

In the substrate processing apparatus 1 according to the embodiment, the plurality of nozzles 120 are provided so as to extend in the horizontal direction, and the plurality of ejection ports are provided side by side in the horizontal direction. Thus, the nozzles 120 may eject the phosphoric acid aqueous solution L in a strip shape.

In the substrate processing apparatus 1 according to the embodiment, the nozzle 120 ejects the processing liquid toward the upper side of the liquid level La of the processing liquid (the phosphoric acid aqueous solution L) stored in the reservoir (the tank 100). Thus, it is possible to store the phosphoric acid aqueous solution L, ejected from the nozzle 120, in the tank 100 with zero waste.

In addition, the substrate processing apparatus 1 according to the embodiment includes the airflow formation mechanism configured to form the gas flow F between the nozzle 120 and the liquid level La of the processing liquid (the phosphoric acid aqueous solution L) stored in the reservoir (the tank 100). Thus, it is possible to efficiently concentrate the phosphoric acid aqueous solution L to a desired concentration.

Furthermore, in the substrate processing apparatus 1 according to the embodiment, the gas has a humidity lower than that in the environment where the substrate processing apparatus 1 is installed. Thus, it is possible to more efficiently concentrate the phosphoric acid aqueous solution L to a desired concentration.

Furthermore, in the substrate processing apparatus 1 according to the embodiment, the gas flow F is formed so as to penetrate the strip-shaped processing liquid (the phosphoric acid aqueous solution L) ejected from the ejection ports. Thus, it is possible to more efficiently concentrate the phosphoric acid aqueous solution L to a desired concentration.

In addition, the substrate processing apparatus 1 according to the embodiment includes the plate member 121 provided between the nozzle 120 and the liquid level La of the processing liquid (the phosphoric acid aqueous solution L) stored in the reservoir (the tank 100). In addition, the nozzle 120 ejects the processing liquid (the phosphoric acid aqueous solution L) toward the plate member 121. Thus, it is possible to more efficiently concentrate the phosphoric acid aqueous solution L to a desired concentration.

Furthermore, in the substrate processing apparatus 1 according to the embodiment, the plurality of plate members 121 are provided so as to partially overlap each other. Thus, it is possible to more efficiently concentrate the phosphoric acid aqueous solution L to a desired concentration.

Furthermore, in the substrate processing apparatus 1 according to the embodiment, the plate member 121 is the mesh plate 121A. Thus, it is possible to more efficiently concentrate the phosphoric acid aqueous solution L to a desired concentration.

In addition, the substrate processing apparatus 1 according to the embodiment includes the bubbling mechanism 130 configured to bubble the processing liquid (the phosphoric acid aqueous solution L) stored in the reservoir (the tank 100). Thus, it is possible to efficiently concentrate the phosphoric acid aqueous solution L to a desired concentration.

Furthermore, the substrate processing apparatus 1 according to the embodiment includes the controller 7 configured to control the substrate processing apparatus 1. The controller 7 reduces the flow rate of the bubbling gases B bubbled by the bubbling mechanism 130 when the processing liquid (the phosphoric acid aqueous solution L) stored in the reservoir (the tank 100) is in a predetermined state. This makes it possible to prevent the phosphoric acid aqueous solution L stored in the tank 100 from being concentrated in excess of a desired concentration.

In addition, the substrate processing apparatus 1 according to the embodiment includes the controller 7 configured to control the substrate processing apparatus 1. The circulation line 110 includes the filter 112 configured to filter the processing liquid (the phosphoric acid aqueous solution L), the bypass line 115 provided to bypass the filter 112, and the opening/closing valve 116 configured to open and close the bypass line 115. In addition, the controller 7 opens the opening/closing valve 116 before the processing liquid (the phosphoric acid aqueous solution L) stored in the reservoir (the tank 100) is brought into the predetermined state, and closes the opening/closing valve 116 after the processing liquid stored in the reservoir is brought into the predetermined state. Thus, it is possible to efficiently concentrate the phosphoric acid aqueous solution L.

In addition, the substrate processing apparatus 1 according to the embodiment includes the plurality of processing liquid generation parts (the phosphoric acid aqueous solution sources 40a). At least one of the processing liquid generation parts (the phosphoric acid aqueous solution sources 40a) heats the processing liquid (the phosphoric acid aqueous solution L) using the heating part (the heater 113) while circulating the processing liquid (the phosphoric acid aqueous solution L) through the circulation line 110, and the other processing liquid generation part supplies the processing liquid remaining in the predetermined state to the processing part (the etching process bath 27). Thus, it is possible to stably etch the wafer W.

The processing liquid concentration method according to the embodiment includes the circulation step, the heating step, and the ejection step. In the circulation step, the processing liquid (the phosphoric acid aqueous solution L) stored in the reservoir (the tank 100) is circulated through the circulation line 110. In the heating step, the processing liquid (the phosphoric acid aqueous solution L) is heated. In the ejection step, the processing liquid heated in the heating step is ejected from above the liquid level La of the processing liquid (the phosphoric acid aqueous solution L) stored in the reservoir (the tank 100), by the nozzle 120 provided at the downstream side of the circulation line 110. This makes it possible to efficiently concentrate the phosphoric acid aqueous solution L as a raw material for an etching liquid, to a desired concentration.

Although the embodiments of the present disclosure have been described above, the present disclosure is not limited to the above-described embodiments, and various modifications can be made without departing from the scope of the present disclosure. For example, in the embodiments described above, the phosphoric acid aqueous solution has been illustrated as an example of a processing liquid to be concentrated. However, the processing liquid to be concentrated is not limited to the phosphoric acid aqueous solution, and may be any processing liquid as long as the processing liquid is capable of being concentrated by heating.

According to the present disclosure, it is possible to efficiently concentrate an aqueous phosphoric acid solution serving as a raw material of a phosphoric acid processing liquid to a desired concentration.

It should be noted that the embodiments and modifications disclosed herein are exemplary in all respects and are not restrictive. The above-described embodiments may be omitted, replaced or modified in various forms without departing from the scope and spirit of the appended claims.

What is claimed is:

1. A substrate processing system comprising:
    a processing part configured to process a substrate with a processing liquid; and
    a processing liquid generation part configured to generate and supply the processing liquid to the processing part, the processing liquid generation part including:
        a reservoir configured to store the processing liquid before being supplied to the processing part;
        a circulation line through which the processing liquid stored in the reservoir is circulated;
        a heater configured to heat the processing liquid that passes through the circulation line;
        a nozzle provided at a downstream side of the circulation line and having at least one ejection port formed to eject the processing liquid heated by the heater from above and onto a liquid level of the processing liquid stored in the reservoir; and
        an airflow formation mechanism comprising a fan filter unit, an intake duct and an exhaust duct, and configured to form a flow of a gas that flows from the fan filter unit to the intake duct, and from the intake duct to the exhaust duct between the nozzle and the liquid level of the processing liquid stored in the reservoir along the liquid level of the processing liquid stored in the reservoir.

2. The substrate processing system of claim 1, wherein the nozzle extends in a horizontal direction, and the at least one ejection port includes a plurality of ejection ports provided side by side in the horizontal direction.

3. The substrate processing system of claim 2, wherein the gas has a humidity lower than that in an environment in which the substrate processing system is installed.

4. The substrate processing system of claim 3, wherein the flow of the gas is formed to penetrate a strip-shaped processing liquid ejected from the at least one ejection port.

5. The substrate processing system of claim 4, further comprising:
    at least one plate member provided between the nozzle and the liquid level of the processing liquid stored in the reservoir,
    wherein the nozzle ejects the processing liquid toward the at least one plate member.

6. The substrate processing system of claim 5, wherein the at least one plate member includes a plurality of plate members provided to partially overlap each other.

7. The substrate processing system of claim 6, wherein the at least one plate member is a mesh plate.

8. The substrate processing system of claim 7, further comprising:
    a bubbling mechanism configured to bubble the processing liquid stored in the reservoir.

9. The substrate processing system of claim 8, further comprising:
    a controller configured to control the substrate processing system,
    wherein the controller is configured to decrease a flow rate of a bubbling gas generated by the bubbling mechanism when the processing liquid stored in the reservoir is brought into a predetermined state.

10. The substrate processing system of claim 9, wherein the circulation line includes a filter configured to filter the processing liquid, a bypass line provided to bypass the filter, and an opening/closing valve configured to open and close the bypass line, and
    wherein the controller is configured to open the opening/closing valve before the processing liquid stored in the reservoir is brought into the predetermined state, and to close the opening/closing valve after the processing liquid stored in the reservoir is brought into the predetermined state.

11. The substrate processing system of claim 10, wherein the processing liquid generation part is installed in plural numbers,
    wherein at least one of the processing liquid generating parts heats the processing liquid with the heater while circulating the processing liquid through the circulation line, and
    wherein another processing liquid generation part supplies the processing liquid remaining in the predetermined state to the processing part.

12. The substrate processing system of claim 5, wherein the at least one plate member is a mesh plate.

13. The substrate processing system of claim 1, wherein the flow of the gas is formed to penetrate a strip-shaped processing liquid ejected from the at least one ejection port.

14. The substrate processing system of claim 1, further comprising:
    at least one plate member provided between the nozzle and the liquid level of the processing liquid stored in the reservoir,
    wherein the nozzle ejects the processing liquid toward the at least one plate member.

15. The substrate processing system of claim 1, further comprising:
    a bubbling mechanism configured to bubble the processing liquid stored in the reservoir.

16. A processing liquid concentration method of a substrate processing system, wherein the substrate processing system comprises a processing part configured to process a substrate with a processing liquid and a processing liquid generation part configured to generate and supply the processing liquid to the processing part, the method comprising:
    circulating the processing liquid stored in a reservoir of the processing liquid generation part through a circulation line of the processing liquid generation part, wherein the reservoir is configured to store the processing liquid before being supplied to the processing part;
    heating the processing liquid passing through the circulation line by a heater of the processing liquid generation part;

ejecting, by a nozzle provided at a downstream side of the circulation line, the processing liquid heated in the heating from above a liquid level of the processing liquid stored in the reservoir onto the liquid level of the processing liquid stored in the reservoir; and
forming, by an airflow formation mechanism comprising a fan filter unit, an intake duct and an exhaust duct, a flow of a gas that flows from the fan filter unit to the intake duct, and from the intake duct to the exhaust duct between the nozzle and the liquid level of the processing liquid stored in the reservoir along the liquid level of the processing liquid stored in the reservoir.

* * * * *